(12) United States Patent
Yano

(10) Patent No.: US 9,917,219 B2
(45) Date of Patent: Mar. 13, 2018

(54) SOLAR CELL

(71) Applicant: SANYO ELECTRIC CO., LTD., Moriguchi-shi, Osaka (JP)

(72) Inventor: Ayumu Yano, Izumiotsu (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/449,198

(22) Filed: Aug. 1, 2014

(65) Prior Publication Data

US 2015/0059839 A1  Mar. 5, 2015

(30) Foreign Application Priority Data

Sep. 4, 2013  (JP) ................................. 2013-182910

(51) Int. Cl.
| | |
|---|---|
| *H01L 31/0747* | (2012.01) |
| *H01L 31/0376* | (2006.01) |
| *H01L 31/028* | (2006.01) |

(52) U.S. Cl.
CPC ...... *H01L 31/03762* (2013.01); *H01L 31/028* (2013.01); *H01L 31/0747* (2013.01); *Y02E 10/547* (2013.01); *Y02E 10/548* (2013.01)

(58) Field of Classification Search
CPC .......... H01L 31/0747; H01L 31/03762; H01L 31/20; H01L 31/202; H01L 31/0745
See application file for complete search history.

(56) References Cited

U.S. PATENT DOCUMENTS

| | | | | |
|---|---|---|---|---|
| 2002/0069911 | A1* | 6/2002 | Nakamura | .......... H01L 31/0745 136/243 |
| 2003/0168660 | A1* | 9/2003 | Terakawa | .......... H01L 31/03762 257/52 |
| 2008/0230121 | A1* | 9/2008 | Terakawa | ............ H01L 31/0352 136/261 |
| 2011/0272012 | A1* | 11/2011 | Heng | .................. H01L 31/0745 136/255 |

(Continued)

FOREIGN PATENT DOCUMENTS

JP  2005-101239 A  4/2005

OTHER PUBLICATIONS

Myong, et al., "Improved light trapping in thin-film silicon solar cells via alternated n-type silicon oxide reflectors", Solar Energy Materials and Solar Cells, vol. 119 (Jun. 15, 2013), pp. 77-83.*

(Continued)

*Primary Examiner* — Bethany L Martin
*Assistant Examiner* — William E McClain
(74) *Attorney, Agent, or Firm* — Metrolexis Law Group, PLLC

(57) ABSTRACT

A solar cell includes: a crystal silicon substrate of a first conductivity type including a first principal surface and a second principal surface; a first amorphous silicon film of a second conductivity type provided on a side of the first principal surface; and a second amorphous silicon film of the first conductivity type provided on a side of the second principal surface. At least one of the first amorphous silicon film and the second amorphous silicon film has a multi-layer structure comprising layers. An oxygen-rich layer is provided between any adjacent two of the amorphous silicon layers in the multi-layer structure.

20 Claims, 1 Drawing Sheet

(56) References Cited

U.S. PATENT DOCUMENTS

| | | | | |
|---|---|---|---|---|
| 2012/0318336 | A1* | 12/2012 | Hekmatshoar-Tabari | H01L 31/035236 136/255 |
| 2013/0167917 | A1* | 7/2013 | Myong | H01L 31/075 136/255 |
| 2014/0166079 | A1* | 6/2014 | Bedell | H01L 31/0504 136/249 |

OTHER PUBLICATIONS

Sritharathikhun, et al. "Optimization of amorphous silicon oxide buffer layer for high-efficiency p-type hydrogenated microcrystalline silicon oxide/n-type crystalline silicon heterojunction solar cells." Japanese Journal of Applied Physics, 47.11R (2008): 8452.*

* cited by examiner

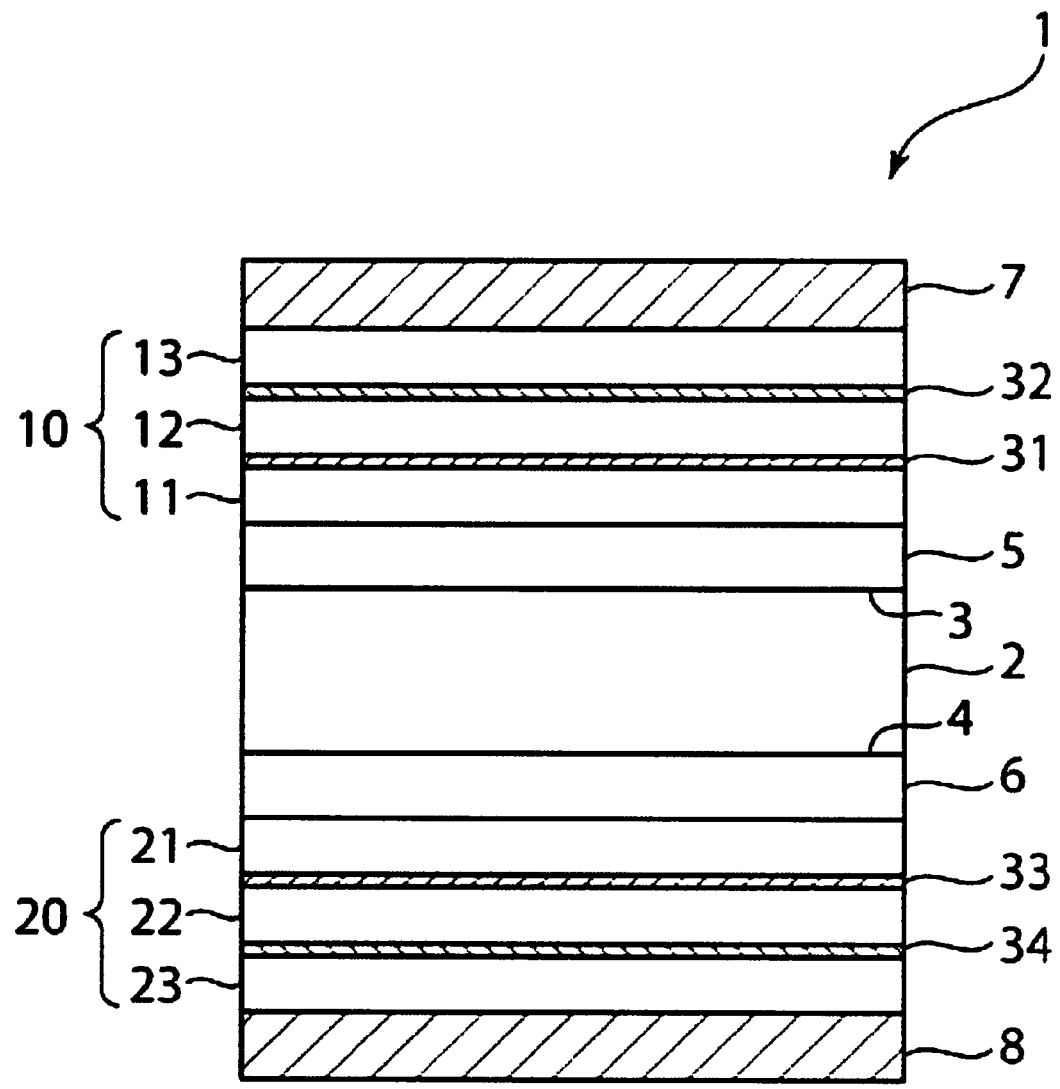

SOLAR CELL

CROSS REFERENCE TO RELATED APPLICATIONS

This application claims priority from prior Japanese Patent Applications No. 2013-182910, filed on Sep. 4, 2013, entitled "SOLAR CELL", the entire contents of which are incorporated herein by reference.

BACKGROUND OF THE INVENTION

1. Field of the Invention

This disclosure relates to a solar cell.

2. Description of Related Art

In order to improve characteristics of a solar cell in which an amorphous silicon thin film is formed on a crystal silicon substrate, it has been proposed to employ, as the amorphous silicon thin film, a multi-layer structure formed by stacking amorphous silicon layers of different properties (Refer to Japanese Patent Application Publication No. 2005-101239, for example).

SUMMARY OF THE INVENTION

However, such multi-layer structure has a problem that properties of amorphous silicon layers in the multi-layer structure are difficult to control since each amorphous silicon layer in the multi-layer structure is affected by an amorphous silicon layer(s) adjacent thereto.

An object of an embodiment of the invention is to provide a solar cell in which an amorphous silicon thin film having a multi-layer structure is formed on a crystal silicon substrate, and a layer in the multi-layer structure is less affected by a layer(s) adjacent thereto.

An aspect of the invention is a solar cell that includes a crystal silicon substrate of a first conductivity type having a first principal surface and a second principal surface, a first amorphous silicon film of a second conductivity type provided on a side of the first principal surface, and a second amorphous silicon film of the first conductivity type provided on a side of the second principal surface, at least one of the first amorphous silicon film and the second amorphous silicon film has a multi-layer structure comprising amorphous silicon layers, and an oxygen-rich layer is provided between adjacent two of the amorphous silicon layers in the multi-layer structure.

According to the above aspect of the invention, the amorphous silicon layers in the multi-layer structure of the amorphous silicon thin film formed on the crystal silicon substrate can be less affected by the adjacent amorphous silicon layer(s) in the multi-layer structure.

BRIEF DESCRIPTION OF DRAWINGS

FIG. 1 is a schematic sectional view illustrating a film structure of a solar cell in accordance with an embodiment.

DETAILED DESCRIPTION OF EMBODIMENTS

Preferred embodiments are described below. It is noted that the embodiment is merely an example, and the invention is not limited to the embodiment. Members having the substantially same functions in the drawing may be given the same reference numerals in some cases.

FIG. 1 is a schematic sectional view illustrating a film structure of a solar cell in accordance with an embodiment. Solar cell 1 shown in FIG. 1 includes crystal silicon substrate 2 of a first conductivity type. Crystal silicon substrate 2 of the first conductivity type includes first principal surface 3 and second principal surface 4. Intrinsic amorphous silicon film 5 is formed on first principal surface 3. First amorphous silicon film 10 of a second conductivity type is provided on intrinsic amorphous silicon film 5. First amorphous silicon film 10 has a multi-layer structure formed by stacking amorphous silicon layers 11, 12, and 13 of the second conductivity type in this order. Transparent electrode 7 is provided on first amorphous silicon film 10.

Intrinsic amorphous silicon film 6 is formed on second principal surface 4 of crystal silicon substrate 2. Second amorphous silicon film 20 of the first conductivity type is provided on intrinsic amorphous silicon film 6. Second amorphous silicon film 20 has a multi-layer structure formed by stacking amorphous silicon layers 21, 22, and 23 of the first conductivity type in this order. Transparent electrode 8 is provided on second amorphous silicon film 20.

Crystal silicon substrate 2 may be made of monocrystal silicon or may be made of polycrystalline silicon. In this description, "amorphous" includes microcrystal.

In this embodiment, in first amorphous silicon film 10, oxygen-rich layer 31 is provided between amorphous silicon layer 11 and amorphous silicon layer 12. Oxygen-rich layer 32 is provided between amorphous silicon layer 12 and amorphous silicon layer 13. In second amorphous silicon film 20, oxygen-rich layer 33 is provided between amorphous silicon layer 21 and amorphous silicon layer 22. Oxygen-rich layer 34 is provided between amorphous silicon layer 22 and amorphous silicon layer 23.

The provision of oxygen-rich layer 31 between amorphous silicon layer 11 and amorphous silicon layer 12 can reduce the influence of the amorphous silicon layer 11 that serves as a foundation layer for amorphous silicon layer 12. Accordingly, amorphous silicon layer 12 can be formed with less influence of properties of amorphous silicon layer 11. Similarly, the provision of oxygen-rich layer 32 between amorphous silicon layer 12 and amorphous silicon layer 13 can reduce the influence of the amorphous silicon layer 12 that serves as a foundation layer for amorphous silicon layer 13 to form amorphous silicon layer 13.

Further, the provision of oxygen-rich layer 33 between amorphous silicon layer 21 and amorphous silicon layer 22 can reduce the influence of amorphous silicon layer 21 that serves as a foundation layer for amorphous silicon layer 22 to form amorphous silicon layer 22. Similarly, the provision of oxygen-rich layer 34 between amorphous silicon layer 22 and amorphous silicon layer 23 can reduce the influence of amorphous silicon layer 22 that serves as a foundation layer for amorphous silicon layer 23 to form amorphous silicon layer 23.

Oxygen-rich layers 31 to 34 each function as a block layer for preventing diffusion of hydrogen, dopant, and so on. Thus, upon formation of the amorphous silicon layer on each oxygen-rich layer, the influence from the amorphous silicon layer that is provided below each oxygen-rich layer can be reduced. Further, after the formation of the thin film, diffusion of hydrogen, dopant, and so on from the adjacent amorphous silicon layers can be prevented.

The oxygen concentration in oxygen-rich layers 31 to 34 is preferably in a range of 1.5 times to 1000 times the oxygen concentration in the amorphous silicon layers adjacent thereto. Preferably, a lower limit value of the oxygen concentration in oxygen-rich layers 31 to 34 is about $1 \times 10^{19}$ $cc^{-1}$, an upper limit value of the oxygen concentration in oxygen-rich layers 31 to 34 is about $1 \times 10^{22}$ $cc^{-1}$, and the oxygen concentration in oxygen-rich layers 31 to 34 is in a range of $5 \times 10^{19}$ $cc^{-1}$ to $5 \times 10^{21}$ $cc^{-1}$. The oxygen concentration in the range can prevent the diffusion of hydrogen, dopant, and so on more effectively.

Preferably, a lower limit value of the thickness of each of oxygen-rich layers 31 to 34 is 0.5 nm, an upper limit value of the thickness of each of oxygen-rich layers 31 to 34 is about 10.0 nm, and the thickness of each of oxygen-rich layer 31 to 34 is in a range of 1.0 nm to 5.0 nm.

When the conductivity type of crystal silicon substrate 2 is n-type, the conductivity type of first amorphous silicon film 10 is p-type, and the conductivity type of the second amorphous silicon film 20 is n-type. When the conductivity type of crystal silicon substrate 2 is p-type, the conductivity type of first amorphous silicon film 10 is n-type, and the conductivity type of second amorphous silicon film 20 is p-type. The above-mentioned effect of the oxygen-rich layer is higher when it is formed between the p-type amorphous silicon layers than when formed between the n-type amorphous silicon layers. This is due to that the p-type amorphous silicon diffuses more hydrogen and dopant than the n-type amorphous silicon, which has a larger influence at the film formation. For this reason, the influence of the adjacent amorphous silicon layers can be further reduced when the oxygen-rich layer is formed between the p-type amorphous silicon layers than when formed between the n-type amorphous silicon layers.

The above-mentioned effect of the oxygen-rich layer is large when oxygen-rich layer 32 of oxygen-rich layers 31, 32 is formed between adjacent two of the amorphous silicon layers closest to transparent electrode 7. The above-mentioned effect of the oxygen-rich layer is also large when oxygen-rich layer 34 of oxygen-rich layers 33, 34 is formed between adjacent two of the amorphous silicon layers closest to transparent electrode 8. The reason is as follows. The amorphous silicon layers close to the respective transparent electrodes requires a high dopant concentration to keep a satisfactory contact resistance against the transparent electrodes, generating a high driving force to diffuse hydrogen and dopant. Consequently, oxygen-rich layer 32 can achieve a larger effect than oxygen-rich layer 34, and oxygen-rich layer 34 can achieve a larger effect than oxygen-rich layer 33.

When comparing oxygen-rich layer 31 with oxygen-rich layer 34, oxygen-rich layer 32 achieves a larger effect than oxygen-rich layer 34. This is due to that the p-type amorphous silicon diffuses more hydrogen and dopant than the n-type amorphous silicon, which has a larger influence at the film formation.

The case where the conductivity type of crystal silicon substrate 2 is n-type, the conductivity type of first amorphous silicon film 10 is p-type, and the conductivity type of second amorphous silicon film 20 is n-type is described below.

Preferably, the dopant concentration in p-type amorphous silicon layers 11 to 13 is higher than that in i-type amorphous silicon layer 5 and is $1 \times 10^{20}$ $cc^{-1}$ or more. Preferably, the thickness of p-type amorphous silicon layers 11 to 13 is small so as to minimize light absorption while being capable of effectively separating carriers generated in crystal silicon substrate 2 at connections and efficiently correcting the carriers at transparent electrode 7. Specifically, the total thickness of p-type amorphous silicon layers 11 to 13 is preferably in a range of 1 nm to 20 nm.

Preferably, the dopant concentration in n-type amorphous silicon layers 21 to 23 is higher than that in i-type amorphous silicon layer 6, and is $1 \times 10^{20}$ $cc^{-1}$ or more. The thickness of n-type amorphous silicon layers 21 to 23 is small so as to minimize light absorption while being capable of effectively separating carriers generated in crystal silicon substrate 2 at connections and efficiently correcting the carriers at transparent electrode 8. Specifically, the total thickness of n-type amorphous silicon layers 21 to 23 is in the range of 1 nm to 20 nm.

Preferably, the p-type or n-type dopant concentration in i-type (intrinsic) amorphous silicon films 5, 6 is $5 \times 10^{18}$ cm or less. The thickness of amorphous silicon films 5, 6 is set small so as to minimize light absorption but is set large enough to make the surface of crystal silicon substrate 2 sufficiently passivated. Specifically, the thickness is preferably in a range of 1 nm to 25 nm, and more preferably in a range of 5 nm to 10 nm.

Transparent electrodes 7, 8 may be made of a transparent conductive oxide such as an indium tin oxide (ITO).

The layers of solar cell 1 can be formed as follows.

First, the surface of crystal silicon substrate 2 is preferably cleaned before the formation of the layers. Specifically, a hydrofluoric acid solution or an RCA cleaning liquid can be used. Preferably, a texture structure is formed on each of the front surface and the back surface of crystal silicon substrate 2 using an alkaline etchant such as a potassium hydroxide solution (KOH solution). In this case, crystal silicon substrate 2 having a (100) plane can be anisotropically etched with the alkaline etchant to a texture structure having pyramid-shaped (111) planes. Further, to improve the integrity between amorphous silicon film 5 and amorphous silicon film 6, an oxidized interface may be formed through predetermined oxidizing treatment before the formation of amorphous silicon film 5 and amorphous silicon film 6. Examples of the predetermined oxidizing treatment include exposure to air or humidity-controlled atmosphere for a predetermined time, ozone water treatment, hydrogen peroxide solution treatment, and ozonizer treatment.

Amorphous silicon film 5, amorphous silicon film 6, amorphous silicon film 10, and amorphous silicon film 20 can be formed by plasma chemical vapor deposition, thermal chemical vapor deposition, optical chemical vapor deposition, and sputtering. The plasma chemical vapor deposition uses any method including a RF plasma method, a VHF plasma method, and a microwave plasma method. In the case of the RF plasma chemical vapor deposition, as shown in Table 1, silicon-containing gas such as silane ($SiH_4$), p-type dopant-containing gas such as diborane ($B_2H_6$), or n-type dopant-containing gas such as phosphine ($PH_3$) is diluted with hydrogen, and the diluted gas is converted into plasma by applying RF high-frequency power to parallel plate electrodes. Then, the plasma gas is fed to the heated surface of crystal silicon substrate 2 to form the above-mentioned silicon film. The substrate temperature at the film formation is preferably in a range of 150° C. to 250° C. The RF power density at the film formation is preferably in a range of 1 $mW/cm^2$ to 10 $mW/cm^2$.

Oxygen-rich layer 31, oxygen-rich layer 32, oxygen-rich layer 33, and oxygen-rich layer 34 can be formed by plasma chemical vapor deposition, thermal chemical vapor deposition, optical chemical vapor deposition, and sputtering. Specifically, these layers can be formed by plasma chemical vapor deposition in oxygen (O)-containing gas atmosphere such as carbon dioxide ($CO_2$) or oxygen ($O_2$). These oxygen-rich layers can be also formed by exposure to air or humidity-controlled atmosphere for a predetermined time, ozone water treatment, hydrogen peroxide solution treatment, and ozonizer treatment. In the case of the RF plasma chemical vapor deposition, as shown in Table 1, oxygen-containing gas such as $CO_2$ is converted into plasma by applying RF high-frequency power to parallel plate electrodes, and then, fed to the heated surface of crystal silicon substrate 2 to form the above-mentioned layers. The substrate temperature at the film formation is preferably in the range of 150° C. to 250° C. The RF power density at the film formation is preferably in the range of 1 mW/cm$^2$ to 10 mW/cm$^2$.

The concentration of each element in the semiconductor can be measured by secondary ion mass spectrometry (SIMS). In the case where crystal silicon substrate 2 is provided with a texture structure, the concentration of each element in the film may be measured in a method whose resolution in the film thickness direction is not subjected to reduction due to the texture.

Transparent electrodes 7, 8 each are formed on amorphous silicon layer 10 or amorphous silicon layer 20. Transparent electrodes 7, 8 include at least one of metal oxides having polycrystalline structure, including indium oxide ($In_2O_3$), zinc oxide (ZnO), tin oxide ($SnO_2$), and titanium oxide ($TiO_2$), and these metal oxides may be doped with a dopant such as tin (Sn), zinc (Zn), tungsten (W), antimony (Sb), titanium (Ti), cerium (Ce), or gallium (Ga). Transparent electrodes 7, 8 can be formed by use of any of thin film formation methods such as physical vapor deposition, chemical vapor deposition, and sputtering. The thickness of each of transparent electrodes 7, 8 is preferably large enough to keep the resistance of the transparent electrode sufficiently small, and small enough to keep the absorption of the transparent electrode sufficiently small, and is preferably a thickness with which the light reflection on the surface can be reduced. Specifically, the thickness of each of transparent electrodes 7, 8 is preferably in a range of 50 nm to 100 nm.

TABLE 1

| LAYER | SUBSTRATE TEMPAR-ATURE [Celsius] | GAS FLOW [sccm] | PRES-SURE [Pa] | POWER DENSITY [mW/cm$^2$] |
|---|---|---|---|---|
| AMORPHOUS SILICON FILM 5 | 150-250 | $H_2$: 100-300 $SiH_4$: 10-50 | 10-100 | 1-10 |
| FIRST AMORPHOUS SILICON FILM 10 | 150-250 | $H_2$: 100-300 $SiH_4$: 10-50 $B_2H_6$: 0.1-0.5 | 10-100 | 1-10 |
| OXYGEN-RICH LAYER 31, 32 | 150-250 | $CO_2$: 1-50 | 10-100 | 1-10 |
| AMORPHOUS SILICON FILM 6 | 150-250 | $H_2$: 100-300 $SiH_4$: 10-50 | 10-100 | 1-10 |
| SECOND AMORPHOUS SILICON FILM 20 | 150-250 | $H_2$: 100-300 $SiH_4$: 10-50 $B_2H_6$: 0.2-1.0 | 10-100 | 1-10 |
| OXYGEN-RICH LAYER 33,34 | 150-250 | $CO_2$: 1-50 | 10-100 | 1-10 |

Although the oxygen-rich layer is provided between every adjacent two of the amorphous silicon layers in the multi-layer structure in the embodiment, the invention is not limited to this. The oxygen-rich layer only needs to be formed between any adjacent two of the amorphous silicon layers in the multi-layer structure. Further, although the intrinsic amorphous silicon film is formed between the crystal silicon substrate and the first amorphous silicon film, and between the silicon substrate and the second amorphous silicon film in the embodiment, the invention is not limited to this. The first amorphous silicon film or the second amorphous silicon film may be formed directly on the crystal silicon substrate.

What is claimed is:

1. A solar cell comprising:
 a crystal silicon substrate of a first conductivity type including a first principal surface and a second principal surface;
 a first amorphous silicon film of a second conductivity type provided on a side of the first principal surface;
 a second amorphous silicon film of the first conductivity type provided on a side of the second principal surface; and
 an intrinsic amorphous silicon film, wherein
 at least one of the first amorphous silicon film and the second amorphous silicon film has a first dopant layer; a second dopant layer; and an oxygen-rich layer provided between the first dopant layer and the second dopant layer, the first dopant layer being closer to the crystal silicon substrate than the second dopant layer, the second dopant layer having a higher dopant concentration than the first dopant layer, wherein the first dopant layer and second dopant layer have the same conductivity type,
 the intrinsic amorphous silicon film is provided between the crystal silicon substrate and the first amorphous silicon film or the second amorphous silicon film that includes the oxygen-rich layer, and
 the oxygen-rich layer has a higher oxygen concentration than the first and second dopant layers, and the oxygen concentration in the oxygen-rich layer is in a range of $1 \times 10^{19}$ cc$^{-1}$ to $1 \times 10^{22}$ cc$^{-1}$.

2. The solar cell according to claim 1, wherein the first conductivity type or the second conductivity type is p-type.

3. The solar cell according to claim 1, wherein the first conductivity type or the second conductivity type is n-type.

4. The solar cell according to claim 1, wherein
 the oxygen-rich layer is provided in each of the first amorphous silicon film and the second amorphous silicon film.

5. The solar cell according to claim 1, wherein
 the oxygen-rich layer is provided between adjacent two of the first and second dopant layers.

6. The solar cell according to claim 1, wherein
 at least one of the first amorphous silicon film and the second amorphous silicon film has a multi-layer structure including amorphous silicon layers, and
 an oxygen-rich layer is provided between every adjacent two of the amorphous silicon layers in the multi-layer structure.

7. The solar cell according to claim 1, wherein a second intrinsic amorphous silicon film is provided between the crystal silicon substrate and the other amorphous silicon film of the first amorphous silicon film or the second amorphous silicon film that includes the oxygen-rich layer.

8. The solar cell according to claim 1, wherein
 the first amorphous silicon film or the second amorphous silicon film that includes the oxygen-rich layer has amorphous silicon layers, and the oxygen concentration in the oxygen-rich layer is in a range of 1.5 times to 1000 times the oxygen concentration in the amorphous silicon layer adjacent thereto.

9. The solar cell according to claim 1, wherein the oxygen concentration in the oxygen-rich layer is in a range of $5\times10^{19}$ $cc^{-1}$ to $5\times10^{21}$ $cc^{-1}$.

10. The solar cell according to claim 1, wherein the thickness of the oxygen-rich layer is in a range of 0.5 nm to 10.0 nm.

11. The solar cell according to claim 10, wherein the thickness of the oxygen-rich layer is in a range of 1.0 nm to 5.0 nm.

12. The solar cell according to claim 1, wherein at least one of the first amorphous silicon film and the second amorphous silicon film has a multi-layer structure including amorphous silicon layers, and the dopant concentrations in the amorphous silicon layers are $1\times10^{20}$ $cc^{-1}$ or more.

13. The solar cell according to claim 1, wherein at least one of the first amorphous silicon film and the second amorphous silicon film has a multi-layer structure including amorphous silicon layers, and the total thickness of the amorphous silicon layers is in a range of 1 nm to 20 nm.

14. The solar cell according to claim 1, further comprising a transparent electrode on an outside surface of the first amorphous silicon film or the second amorphous silicon film that includes the oxygen-rich layer, the transparent electrode being made of a transparent conductive oxide, wherein
the second dopant layer is closer to the transparent electrode than the first dopant layer.

15. A solar cell comprising:
a crystal silicon substrate of a first conductivity type including a first principal surface and a second principal surface;
a first amorphous silicon film of a second conductivity type provided on a side of the first principal surface;
a second amorphous silicon film of the first conductivity type provided on a side of the second principal surface; and
an intrinsic amorphous silicon film, wherein
at least one of the first amorphous silicon film and the second amorphous silicon film has a first dopant layer; a second dopant layer; and an oxygen-rich layer provided between the first dopant layer and the second dopant layer, the first dopant layer being closer to the crystal silicon substrate than the second dopant layer, the second dopant layer having a higher dopant concentration than the first dopant layer, wherein the first dopant layer and second dopant layer have the same conductivity type,
the intrinsic amorphous silicon film is provided between the crystal silicon substrate and the first amorphous silicon film or the second amorphous silicon film that includes the oxygen-rich layer, and
the oxygen-rich layer has a higher oxygen concentration than the first and second dopant layers.

16. The solar cell according to claim 15, wherein the first conductivity type or the second conductivity type is p-type.

17. The solar cell according to claim 15, wherein the first conductivity type or the second conductivity type is n-type.

18. The solar cell according to claim 15, wherein the oxygen-rich layer is provided in each of the first amorphous silicon film and the second amorphous silicon film.

19. The solar cell according to claim 15, wherein the oxygen-rich layer is provided between adjacent two of the first and second dopant layers.

20. The solar cell according to claim 15, wherein a second intrinsic amorphous silicon film is provided between the crystal silicon substrate and the other amorphous silicon film of the first amorphous silicon film or the second amorphous silicon film that includes the oxygen-rich layer.

* * * * *